United States Patent
Takiguchi

(10) Patent No.: US 7,990,300 B2
(45) Date of Patent: Aug. 2, 2011

(54) D/A CONVERSION CIRCUIT

(75) Inventor: Tomio Takiguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/632,511

(22) Filed: Dec. 7, 2009

(65) Prior Publication Data

US 2010/0141496 A1 Jun. 10, 2010

(30) Foreign Application Priority Data

Dec. 8, 2008 (JP) ................................. 2008-311727

(51) Int. Cl.
*H03M 1/66* (2006.01)
(52) U.S. Cl. ........................................ 341/144; 341/145
(58) Field of Classification Search .................. 341/144, 341/145, 150, 153, 137; 327/103, 113, 427, 327/434, 65, 96, 334
See application file for complete search history.

(56) References Cited

U.S. PATENT DOCUMENTS 7,557,743 B2 * 7/2009 Imai ............................... 341/144

FOREIGN PATENT DOCUMENTS

| JP | 3-40524 A | 2/1991 |
| JP | 2001-136088 A | 5/2001 |
| JP | 2002-26729 A | 1/2002 |
| JP | 2004-80238 A | 3/2004 |
| JP | 2006-197052 A | 7/2006 |

* cited by examiner

*Primary Examiner* — Joseph Lauture
(74) *Attorney, Agent, or Firm* — Foley & Lardner LLP

(57) ABSTRACT

DAC includes a reference current setting unit (RCSU) that sets reference current, and current cell output unit (CCOU) including plurality of current sources, the current sources being configured to output currents corresponding to the reference current, the CCOU being configured to generate analog voltage signal according to an input digital signal, wherein the RCSU includes, reference current source (RCS) that generates the reference current, first and second resistance through which the reference current flows, selection control circuit that, when amplitude level of the analog voltage signal is to be changed, selects at least one of the first and second resistances and connect the selected resistance to the RCS, and reference current control circuit that controls current amount of reference current of the RCS according to voltage generated by resistance selected from among the first and second resistances.

10 Claims, 7 Drawing Sheets

Fig. 3

| INPUT VALUE (DECIMAL NUMBER) | DIGITAL INPUT CODE (D3, D2, D1, D0) | Iout | ANALOG OUTPUT VOLTAGE Vout | |
|---|---|---|---|---|
| | | | VOLTAGE AMPLITUDE SETTING SIGNAL/LOW LEVEL | VOLTAGE AMPLITUDE SETTING SIGNAL/HIGH LEVEL |
| 0 | (0, 0, 0, 0) | 0 | 0 | 0 |
| 1 | (0, 0, 0, 1) | I×1 | (1/7) × (Vref/R1) × RL | (1/7) × (Vref/R2) × RL |
| 2 | (0, 0, 1, 0) | I×2 | (2/7) × (Vref/R1) × RL | (2/7) × (Vref/R2) × RL |
| 3 | (0, 0, 1, 1) | I×3 | (3/7) × (Vref/R1) × RL | (3/7) × (Vref/R2) × RL |
| 4 | (0, 1, 0, 0) | I×4 | (4/7) × (Vref/R1) × RL | (4/7) × (Vref/R2) × RL |
| 5 | (0, 1, 0, 1) | I×5 | (5/7) × (Vref/R1) × RL | (5/7) × (Vref/R2) × RL |
| 6 | (0, 1, 1, 0) | I×6 | (6/7) × (Vref/R1) × RL | (6/7) × (Vref/R2) × RL |
| 7 | (0, 1, 1, 1) | I×7 | (7/7) × (Vref/R1) × RL | (7/7) × (Vref/R2) × RL |
| 8 | (1, 0, 0, 0) | I×8 | (8/7) × (Vref/R1) × RL | (8/7) × (Vref/R2) × RL |
| 9 | (1, 0, 0, 1) | I×9 | (9/7) × (Vref/R1) × RL | (9/7) × (Vref/R2) × RL |
| 10 | (1, 0, 1, 0) | I×10 | (10/7) × (Vref/R1) × RL | (10/7) × (Vref/R2) × RL |
| 11 | (1, 0, 1, 1) | I×11 | (11/7) × (Vref/R1) × RL | (11/7) × (Vref/R2) × RL |
| 12 | (1, 1, 0, 0) | I×12 | (12/7) × (Vref/R1) × RL | (12/7) × (Vref/R2) × RL |
| 13 | (1, 1, 0, 1) | I×13 | (13/7) × (Vref/R1) × RL | (13/7) × (Vref/R2) × RL |
| 14 | (1, 1, 1, 0) | I×14 | (14/7) × (Vref/R1) × RL | (14/7) × (Vref/R2) × RL |
| 15 | (1, 1, 1, 1) | I×15 | (15/7) × (Vref/R1) × RL | (15/7) × (Vref/R2) × RL |

D/A CONVERSION CIRCUIT

BACKGROUND

1. Field of the Invention

The present invention relates to a D/A conversion circuit, in particular a current output type D/A conversion circuit.

2. Description of Related Art

There are various voltage amplitude formats for television signals, including 1V amplitude for component signals (Y: brightness, Pr: color-difference signal 1, and Pb: color-difference signal 2), and 1.32V amplitude for NTSC signals including a copyguard function. Furthermore, there are also voltage amplitude formats for connection to analog monitors of personal computers, including 0.7V amplitude for RGB signals. As described above, there are a variety of voltage amplitude formats for video signals of television and the like. Further, there are other various voltage amplitude formats for applications other than video signals of television and the like.

Conventionally, different current output type D/A conversion circuits have been used for each of these various voltage amplitude formats. FIG. 6 shows a typical current output type D/A conversion circuit 1 in the related art. As shown in FIG. 6, the current output type D/A conversion circuit 1 includes a reference current setting unit 10 and a current cell output unit 20. The reference current setting unit 10 includes a differential amplifier AMP11, a PMOS transistor M11, and a resistive element R11. A source-drain current Iref flowing through PMOS transistor M11 flows to the resistive element R11. In this way, a potential generated at the node A is input to the non-inverting input terminal of the differential amplifier AMP11. A reference voltage Vref is input to the inverting terminal of the differential amplifier AMP11, and the output terminal of the differential amplifier AMP11 is connected to the gate of the PMOS transistor M11. Therefore, with this configuration, a negative feedback is applied such that the voltage at the node A becomes equal to the reference voltage Vref.

The current cell output unit 20 includes PMOS transistors M21 to M2$m$, switch circuits SW21 to SW2$m$, and an output resistive element R21. The PMOS transistor M11 and the PMOS transistors M21 to M2$m$ constitute a current-mirror circuit that uses the PMOS transistor M11 as an input transistor. Therefore, the PMOS transistors M21 to M2$m$ can feed an amount of current according to the source-drain current flowing through the PMOS transistor M11 based on their respective current-mirror ratios.

The switch circuits SW21 to SW2$m$ are controlled into On-states or Off-states according to an input digital signal. Among these PMOS transistors M21 to M2$m$, transistors that are turned on according to the value of the digital signal let currents flow between their sources and drains, and their added current is supplied to the node B. This added current is what is obtained by converting the above-mentioned digital signal into an analog current signal. In the following explanation, this analog current signal is referred to as "D/A conversion current Ida". By feeding this D/A conversion current Ida through the output resistive element R21, an analog output voltage Vout can be generated. The above-mentioned standards are determined such that the amplitude level of this output voltage Vout becomes 0.7V amplitude, 1V amplitude, or 1.3V amplitude or the like as described above.

In recent years, the demand for reduction in manufacturing costs and the like has been growing. Therefore, if the above-described various voltage amplitude formats can be dealt with by a single current output type D/A conversion circuit with ease, the number of necessary current output type D/A conversion circuits can be reduced, and thus enabling the reduction in manufacturing costs of chips. Note that examples of the current output type D/A conversion circuit capable of changing the amplitude level of the voltage Vout output from the current cell output unit include a technique disclosed in Japanese Unexamined Patent Application Publication No. 2002-26729 (Patent document 1). Further, Japanese Unexamined Patent Application Publication No. 2006-197052 (Patent document 2) discloses a technique for a D/A conversion circuit capable of reducing influences by manufacturing variations.

SUMMARY

FIG. 7 shows a simplified configuration of a current output type D/A conversion circuit disclosed in Patent document 1 as prior art. As shown in FIG. 7, the current output type D/A conversion circuit 2 includes a reference current generation unit 30, a current cell unit 40, a ladder type resistance circuit 50, and a control circuit 60. A PMOS transistor Q30 of the reference current generation unit 30 is connected to PMOS transistors Q41 to Q4$m$ of the current cell unit 40 in a current-mirror connection. Therefore, an amount of current corresponding to the source-drain current flowing through the PMOS transistor Q30 flows through each of the PMOS transistors Q41 to Q4$m$. Other structures and operations of the current cell unit 40 are substantially similar to those of the current cell output unit 20 shown in FIG. 6, and therefore their explanation is omitted.

The ladder type resistance circuit 50 includes resistive elements R51 to R5$n$+1 and switch circuits SW51 to SW5$n$. The resistive elements R51 to R5$n$+1 are serially connected in order from a ground terminal to a terminal A of the reference current generation unit 30. Each of the switch circuits SW51 to SW5$n$ is connected between a corresponding one of connection nodes of the resistive elements R51 to R5$n$+1 and the ground terminal. Among the switch circuits SW51 to SW5$n$, one of them is selected by a control signal from the control circuit 60 and turned on.

Therefore, the number of resistive elements between the terminal A of the reference current generation unit 30 and the ground terminal is changed according to the control signal from the control circuit 60. As a result, the source-drain current of the PMOS transistor Q30 of the reference current generation unit 30 (hereinafter referred to as "reference current Iref") is changed. As described above, by changing the reference current Iref, the source-drain currents of the PMOS transistors Q41 to Q4$m$, which are connected to the PMOS transistor Q30 of the reference current generation unit 30 in a current-mirror connection, can be changed, and thereby enabling the voltage amplitude level of the output voltage Vout to be also changed.

Note that the current output type D/A conversion circuit 2 controls the reference current Iref output from the reference current generation unit 30 by turning on one of the switch circuits SW51 to SW5$n$ of the ladder type resistance circuit 50. Therefore, the reference current Iref is determined by the combined resistance value of the combined resistance of resistive elements connected between the switch circuit selected by the control circuit 60 and the terminal A, and the on-resistance of the selected switch circuit.

For example, assume a case where a switch circuit SW51 is selected in FIG. 7. Assume also that the on-resistance of the switch circuit SW51 is Rsw51. The voltage of the terminal A is maintained at a voltage Vref by the AMP30. Therefore, the reference current Iref is expressed as Iref=Vref/(R52+ . . . +R5$n$+R5$n$+1+Rsw51). Note that the signs "R51"

to "R5n+1" represent the resistance values of the resistive elements as well as their names. As shown above, the reference current Iref includes the on-resistance Rsw51 of the selected switch circuit SW51. The on-resistance of the switch circuit varies due to manufacturing variations and variations in temperature characteristics. Therefore, in order to obtain the reference current Iref with high accuracy, the on-resistance Rsw51 of the switch circuit SW51 needs to be decreased to such a level that it can be negligible in comparison to the combined resistance (R52+ . . . +R5n+R5n+1).

More specifically, for example, assuming that (R52+ . . . +R5n+R5n+1)=1 kΩ and Rsw51=10Ω, the current accuracy of the reference current Iref could deviate by about 1% due to variations in the on-resistance of the switch circuit SW51. As a result, the voltage amplitude of the output voltage Vout output from the current cell unit 40 could also vary. In order to solve this problem, it is necessary to reduce the on-resistance of the switch circuit. However, to reduce the on-resistance of a switch circuit, the size of the switch circuit needs to be considerably increased in its design, and thus raising a problem that the chip size increases.

A first exemplary aspect of an embodiment of the present invention is a D/A conversion circuit including: a reference current setting unit that sets a reference current; and a current cell output unit including a plurality of constant-current sources, the constant-current sources being configured to output currents corresponding to the reference current, the current cell output unit being configured to generate an analog voltage signal generated from an analog current signal obtained by adding up output currents from the constant-current sources according to a value of an input digital signal, wherein the reference current setting unit includes: a reference current source that generates the reference current; a first resistive element through which the reference current flows; a second resistive element through which the reference current flows; a selection control circuit that, when an amplitude level of the analog voltage signal is to be changed, selects at least one of the first and second resistive elements and connect the selected resistive element to the reference current source; and a reference current control circuit that controls a current amount of a reference current of the reference current source according to a voltage generated by a resistive element selected from among the first and second resistive elements.

A D/A conversion circuit in accordance with an exemplary aspect of the present invention controls a current amount of the reference current, by a selection control circuit, according to a voltage generated by a resistive element selected from among the first and second resistive elements. Accordingly, the above-mentioned selection control circuit does not use a current signal for the adjustment of the reference current, and therefore it is unnecessary to take the on-resistance of an active element within the control circuit into consideration.

A D/A conversion circuit in accordance with an exemplary aspect of the present invention can minimize the increase in the circuit area while realizing a variable voltage amplitude level for the analog output signal to be generated.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 3 is a table for explaining a D/A conversion operation of a D/A conversion circuit in accordance with an exemplary embodiment of the present invention;

DETAILED DESCRIPTION OF THE EXEMPLARY EMBODIMENTS

First Exemplary Embodiment

Figure 1:
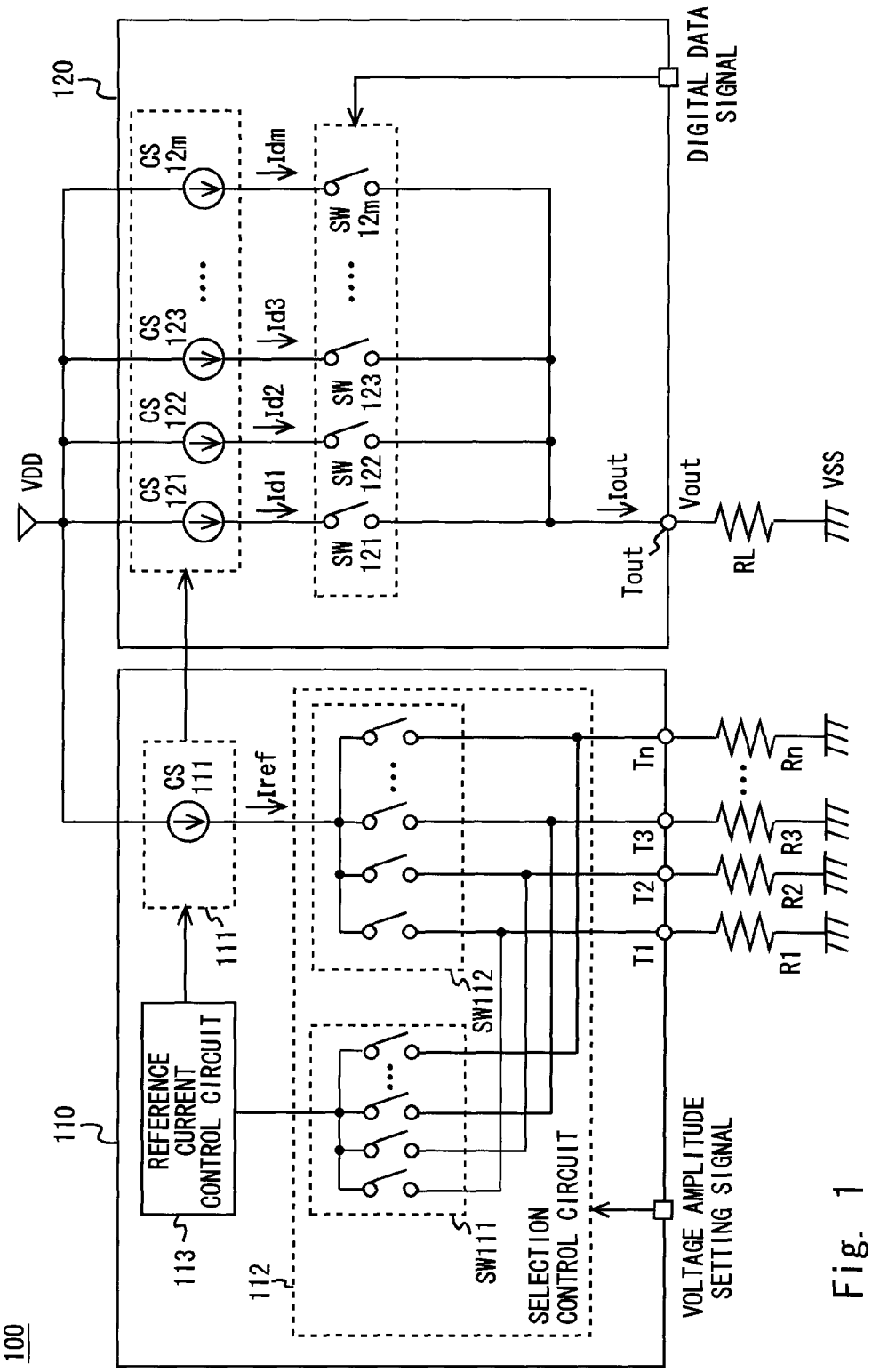
FIG. 1 shows an example of a block configuration of a D/A conversion circuit in accordance with an exemplary embodiment of the present invention.

Specific exemplary embodiments to which the present invention is applied are explained hereinafter in detail with reference to the drawings. In this first exemplary embodiment, the present invention is applied to a current output type D/A conversion circuit that generates a video signal, such as an analog connection type display device. FIG. 1 shows a block configuration of a current output type D/A conversion circuit 100 in accordance with this exemplary embodiment of the present invention.

As shown in FIG. 1, the D/A conversion circuit 100 includes a reference current setting unit 110, a current cell output unit 120, an adjustment resistances R1 to Rn (n: positive integer), and a load resistance RL. The reference current setting unit 110 includes a reference current generation current source 111, a selection control circuit 112, and a reference current control circuit 113.

The reference current generation current source 111 outputs a reference current Iref according to a control signal from the reference current control circuit 113. Note that in the example of FIG. 1, although the reference current generation current source 111 includes only one constant-current source SC111, it may include additional one or more constant-current sources. In such a case, the output current of those one or more constant-current sources is also controlled according to a control signal from the reference current control circuit 113. Then, the total current output from these plural constant-current sources becomes the reference current Iref.

The selection control circuit 112 includes switch circuits SW111 and SW112. The switch circuit SW112 selects one of terminals T1 to Tn (n: positive integer) according to a voltage amplitude setting signal, and connects the selected terminal to the current source 111. That is, it has a function of feeding the reference current Iref supplied from the current source 111 to one of the terminals T1 to Tn according to the voltage amplitude setting signal. Note that one terminal of each of the adjustment resistances R1 to Rn is connected to a corresponding one of the terminals T1 to Tn. Further, the other terminals of the respective adjustment resistances R1 to Rn are connected to a ground terminal VSS. Therefore, one of the adjustment resistances R1 to Rn is selected by the above-described function of the switch circuit SW112, and the reference current Iref flows to the selected adjustment resistance. These adjustment resistances R1 to Rn may be arranged outside the one-chipped D/A conversion circuit 100, instead of being embedded within the D/A conversion circuit 100. That is, the adjustment resistances R1 to Rn are connected to external terminals T1 to Tn of the one-chipped reference current setting unit 110. By adopting such a structure, the resistive elements can be easily replaced. Alternatively, the adjustment resistances R1 to Rn may be embedded into and integrated with the reference current setting unit 110.

The switch circuit SW111 selects one of the terminals T1 to Tn according to a voltage amplitude setting signal, and connects the selected terminal to the reference current control circuit 113. The terminals T1 to Tn that are to be selected by this switch circuit SW111 are the same ones that are to be selected by the switch circuit SW112 and connected to the current source 111. That is, a voltage value occurring by a voltage drop, which is caused by one of the adjustment resistances R1 to Rn and by the reference current Iref, is input to the reference current control circuit 113. Note that the voltage amplitude setting signal is transmitted from an external setting signal output circuit (not shown) in the case where the amplitude level of an analog voltage signal that occurs in the load resistance RL (which is explained later) is to be changed.

The reference current control circuit 113 controls the reference current Iref output from the reference current generation current source 111 according to a voltage value occurring by the voltage drop by one of adjustment resistances R1 to Rn selected by the selection control circuit 112. Note that although the selection control circuit 112 selects one adjustment resistance, through which the reference current Iref flows, from the adjustment resistances R1 to Rn in the above explanation, the selection control circuit 112 may select more than one adjustment resistance from the adjustment resistances R1 to Rn. However, in such a case, a voltage value that is generated by a voltage drop caused by the combined resistance of those selected resistances is input to the reference current control circuit 113.

The current cell output unit 120 includes constant-current sources CS121 to CS12m (m: positive integer) and switch circuits SW121 to SW12m. The constant-current source circuits CS121 to CS12m (m: positive integer) generate their respective currents Id1 to Idm (m: positive integer) according the reference current Iref generated by the reference current generation current source 111. For example, the constant-current source circuit CS121 may output a current Id1 that is equal to the reference current Iref; the constant-current source circuit CS122 may output a current Id2 that is twice as large as the reference current Iref; the constant-current source circuit CS123 may output a current Id3 that is four times as large as the reference current Iref; . . . ; and the constant-current source circuit CS12m may output a current Idm, the value of which is obtained by multiplying the reference current Iref by the (m−1)th power of 2. Alternatively, for example, the constant-current source circuits CS121 to CS12m may output their respective currents Id1 to Idm, each of which is equal to the reference current Iref.

One of the terminals of each of the switch circuits SW121 to SW12m is connected to a current output terminal of a corresponding one of the constant-current source circuits CS121 to CS12m. The other terminals of the respective switch circuits SW121 to SW12m are connected to an output terminal Tout. The switch circuits SW121 to SW12m receive a digital data signal from an external decoder circuit or the like, and controlled into On-states or Off-states according to the value of its digital data. Therefore, an output current Iout flowing to the output terminal Tout has a current value obtained by adding up the currents Id1 to Idm that flow according to this digital data signal. For example, if the values of m-bit digital data are all "1", the output current Iout has a current value obtained by adding up all the currents Id1 to Idm, i.e., current value (Id1+Id2+ . . . +Idm). In the following explanation, the current value obtained in this situation is referred to as "full-scale current Ifs". On the other hand, if the values of m-bit digital data are all "0", the output current Iout also becomes "0", and no current flows to the output terminal Tout.

The load resistance RL is connected between the terminal Tout and the ground terminal VSS. Therefore, the output current Iout that flows from the output terminal Tout flows to the load resistance RL. Accordingly, an output voltage Vout is generated by a voltage drop occurring in the load resistance RL. This output voltage Vout has the minimum voltage value when no current flows through the load resistance RL, and has the maximum voltage value when the full-scale current Ifs flows through the load resistance RL. Therefore, the output voltage Vout varies between these minimum and maximum values according to the value of the above-mentioned digital data. That is, the amplitude level of the output voltage Vout is determined by the full-scale current Ifs flowing to the load resistance RL.

Figure 2:
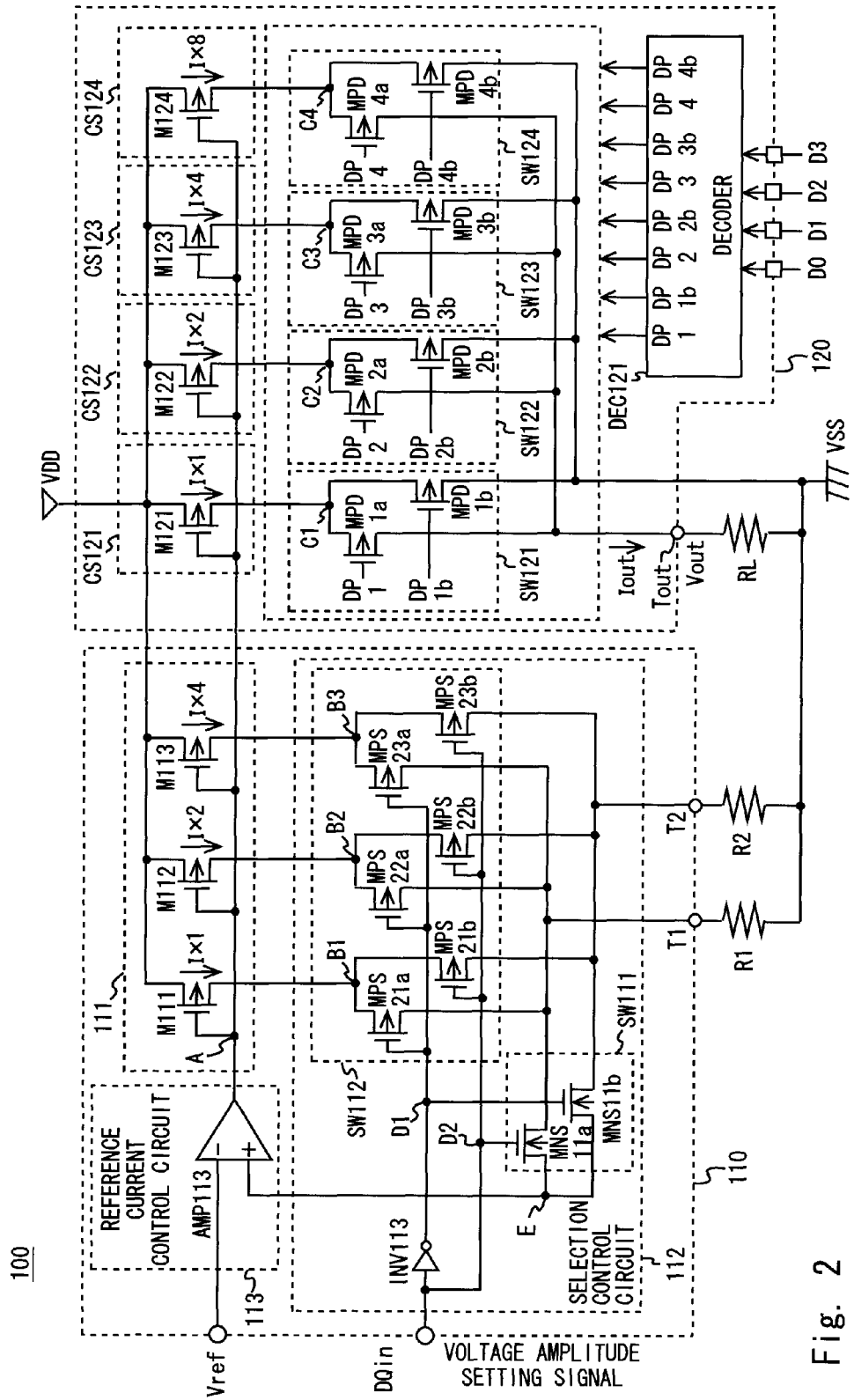
FIG. 2 shows an example of a detailed circuit configuration of a D/A conversion circuit in accordance with an exemplary embodiment of the present invention.

FIG. 2 shows an example of a more specific circuit configuration of a D/A conversion circuit 100. Note that the explanation is made with an assumption that the number of adjustment resistances is two and the resolution of the current cell output unit 120 is four bits. That is, assume that n=2 and m=4. Further, the reference current generation current source 111 is assumed to include three constant-current source circuits.

As shown in FIG. 2, the reference current generation current source 111 includes PMOS transistors M111 to M113. The source, drain, and gate of the PMOS transistor M111 are connected to a power-supply voltage terminal VDD, a node B1, and a node A respectively. The source, drain, and gate of the PMOS transistor M112 are connected to the power-supply voltage terminal VDD, a node B2, and the node A respectively. The source, drain, and gate of the PMOS transistor M113 are connected to the power-supply voltage terminal VDD, a node B3, and the node A respectively. As can be seen from this configuration, the PMOS transistors M111 to M113 have a current-mirror connection configuration. Further, assume that the current-mirror ratios of the PMOS transistors M111, M112 and M113 are expressed as 1:2:4 respectively. Therefore, if the PMOS transistor M111 lets a current of I×1 flow therethrough, the PMOS transistors M112 and M113 let currents of I×2 and I×4, respectively, flow therethrough. These ratios of the current amounts may be realized by adjusting the ratios of gate widths of the respective transistors in their design. Further, the total current output from these PMOS transistors M111 to M113 becomes the reference current Iref.

The switch circuit SW112 includes PMOS transistors MPS21a, MPS21b, MPS22a, MPS22b, MPS23a and MPS23b. The source, drain, and gate of the PMOS transistor MPS21a are connected to the node B1, a terminal T1, and a node D1 respectively. The source, drain, and gate of the PMOS transistor MPS21b are connected to the node B1, a terminal T2, and a node D2 respectively. The source, drain, and gate of the PMOS transistor MPS22a are connected to the node B2, the terminal T1, and the node D1 respectively. The source, drain, and gate of the PMOS transistor MPS22b are connected to the node B2, the terminal T2, and the node D2 respectively. The source, drain, and gate of the PMOS transistor MPS23a are connected to the node B3, the terminal T1, and the node D1 respectively. The source, drain, and gate of the PMOS transistor MPS23b are connected to the node B3, the terminal T2, and the node D2 respectively.

The switch circuit SW112 includes NMOS transistors MNS11a and MNS11b. One of the source and drain of the NMOS transistor MNS11*a* is connected to the terminal T1 and the other of the source and drain thereof is connected to a node E. Further, the gate of the NMOS transistor MNS11*a* is connected to the node D2. One of the source and drain of the NMOS transistor MNS11*b* is connected to the terminal T2 and the other of the source and drain thereof is connected to the node E. Further, the gate of the NMOS transistor MNS11*b* is connected to the node D1.

One terminal of adjustment resistances R1 and R2 are connected to the terminals T1 and T2 respectively. Further, the other terminals of the respective adjustment resistances R1 and R2 are connected to the ground terminal VSS.

The reference current control circuit 113 includes an amplifier AMP113. The non-inverting input terminal, inverting input terminal, and output terminal of the amplifier AMP113 are connected to the node E, a reference voltage input terminal Vref, and the node A respectively. A predetermined voltage is supplied to the reference voltage input terminal Vref. In the following explanation, for the sake of convenience, the sign "Vref" also represents a reference voltage supplied from the reference voltage input terminal as well as its name. The amplifier AMP113 uses the reference voltage Vref as a reference voltage, and amplifies and outputs the difference between the reference voltage Vref and a voltage at the node E.

The selection control circuit 112 includes an inverter circuit INV112 in addition to the switch circuits SW111 and SW112. The input terminal of the inverter circuit INV112 is connected to a setting signal input terminal DQin from which a voltage amplitude setting signal is input, and the output terminal of the inverter circuit INV112 is connected to the node D1. Note that the setting signal input terminal DQin is directly connected to the node D2. Therefore, the voltage amplitude setting signal is applied to the node D2, and a signal obtained by inverting the phase of the voltage amplitude setting signal is applied to the node D1.

Accordingly, when the voltage amplitude setting signal is at a High level, a current Iref flows to the terminal T1, and at the same time, the terminal T1 is connected to the non-inverting terminal of the amplifier AMP113. On the other hand, when the voltage amplitude setting signal is at a Low level, a current Iref flows to the terminal T2, and at the same time, the terminal T2 is connected to the non-inverting terminal of the amplifier AMP113. That is, the selection control circuit 112 controls the transistors of the switch circuit SW111 and SW112 into On-states or Off-states according to the signal level of the voltage amplitude setting signal. Then, it selects one of the adjustment resistances R1 and R2 to which the current Iref to be fed, and transfers a voltage occurring at the terminal T1 or T2 at that state to the non-inverting terminal of the amplifier AMP113.

Note that if the reference current Iref output from the reference current generation current source 111 is large, the transistor size of the transistors included in the selection control circuit 112 needs to be increased. Therefore, to ensure the high-response-speed capability of the selection control circuit 112, a buffer circuit for current buffering may be connected between the setting signal input terminal DQin and the nodes D1 and D2.

The current cell output unit 120 includes a decoder DEC121, PMOS transistors M121 to M124, and PMOS transistors MPD1*a*, MPD1*b*, MPD2*a*, MPD2*b*, MPD3*a*, MPD3*b*, MPD4*a* and MPD4*b*. Note that the PMOS transistors M121 to M124 correspond to the respective constant-current sources CS121 to CS124. Further, the PMOS transistors MPD1*a* and MPD1*b* correspond to the switch circuits SW121; the PMOS transistors MPD2*a* and MPD2*b* correspond to the switch circuits SW122; the PMOS transistors MPD3*a* and MPD3*b* correspond to the switch circuits SW123; and the PMOS transistors MPD4*a* and MPD4*b* correspond to the switch circuits SW124.

The source, drain, and gate of the PMOS transistor M121 are connected to a power-supply voltage terminal VDD, a node C1, and the node A respectively. The source, drain, and gate of the PMOS transistor M122 are connected to the power-supply voltage terminal VDD, a node C2, and the node A respectively. The source, drain, and gate of the PMOS transistor M123 are connected to the power-supply voltage terminal VDD, a node C3, and the node A respectively. The source, drain, and gate of the PMOS transistor M124 are connected to the power-supply voltage terminal VDD, a node C4, and the node A respectively.

The source and drain of the PMOS transistor MPD1*a* are connected to the node C1 and a terminal Tout respectively. Further, a control signal DP1 is input from the decoder DEC121 to the gate of the PMOS transistor MPD1*a*. The source and drain of the PMOS transistor MPD are connected to the node C1 and a ground terminal VSS respectively. Further, a signal DP1*b*, which is the inverted signal of the control signal DP1, is input to the gate of the PMOS transistor MPD1*b*. The source and drain of the PMOS transistor MPD2*a* are connected to the node C2 and the terminal Tout respectively. Further, a control signal DP2 is input from the decoder DEC121 to the gate of the PMOS transistor MPD2*a*. The source and drain of the PMOS transistor MPD2*b* are connected to the node C2 and the ground terminal VSS respectively. Further, a signal DP2*b*, which is the inverted signal of the control signal DP2, is input to the gate of the PMOS transistor MPD2*b*.

The source and drain of the PMOS transistor MPD3*a* are connected to the node C3 and the terminal Tout respectively. Further, a control signal DP3 is input from the decoder DEC121 to the gate of the PMOS transistor MPD3*a*. The source and drain of the PMOS transistor MPD3*b* are connected to the node C3 and the ground terminal VSS respectively. Further, a signal DP3*b*, which is the inverted signal of the control signal DP3, is input to the gate of the PMOS transistor MPD3*b*. The source and drain of the PMOS transistor MPD4*a* are connected to the node C4 and the terminal Tout respectively. Further, a control signal DP4 is input from the decoder DEC 121 to the gate of the PMOS transistor MPD4*a*. The source and drain of the PMOS transistor MPD4*b* are connected to the node C4 and the ground terminal VSS respectively. Further, a signal DP4*b*, which is the inverted signal of the control signal DP4, is input to the gate of the PMOS transistor MPD4*b*.

As can be seen from this configuration, the PMOS transistors M121 to M124 are connected with PMOS transistors M111 to M113 of the reference current generation current source 111 in a current-mirror connection. Further, assume that the current-mirror ratios of the PMOS transistors M121, M122, M123 and M124 are expressed as 1:2:4:8, respectively, with respect to the PMOS transistor M111 of the reference current generation current source 111. Therefore, if the PMOS transistor M111 lets a current of I×1 flow therethrough, the PMOS transistors M121, M122, M123 and M124 let currents of I×1, I×2, I×4 and I×8, respectively, flow therethrough. These ratios of current amounts correspond to weights assigned to the respective bits of the input digital signal. These ratios of the current amounts may be realized by adjusting the ratios of gate widths of the respective transistors in their design.

Note that if the transistor size of the switch circuits SW121 to SW12*m* is large, a buffer circuit for current buffering may be connected between the decoder DEC 121 and the switch circuits SW121 to SW12m to ensure a high-switch-response-speed capability.

The decoder DEC121 receives a digital signal, and outputs control signals DP1, DP1b, DP2, DP2b, DP3, DP3b, DP4 and DP4b according to the digital code D[0:3] of a received digital signal. Note that the control signals DP1b, DP2b, DP3b and DP4b are signals obtained by inverting the phases of their respective control signal DP1, DP2, DP3 and DP4. Further, the digital code D[0] corresponds to the control signals DP1 and DP1b; the digital code D[1] corresponds to the control signals DP2 and DP2b; the digital code D[2] corresponds to the control signals DP3 and DP3b; and the digital code D[3] corresponds to the control signals DP4 and DP4b.

For example, if the value of the digital signal D[0:3] is "0011", the control signals DP1, DP2, DP3b and DP4b become a Low level and the control signals DP1b, DP2b, DP3 and DP4 become a High level. Consequently, the PMOS transistors MPD1a, MPD2a, MPD3b and MPD4b become an On-state, and the PMOS transistors MPD1b, MPD2b, MPD3a and MPD4a become an Off-state. As a result, the output current Tout has a current amount of I×3.

Further, for example, if the value of the digital signal D[0:3] is "1111", the control signals DP1, DP2, DP3 and DP4 become a Low level and the control signals DP1b, DP2b, DP3b and DP4b become a High level. As a result, the output current Tout has a current amount of I×15. In this case, the output current Tout is a current obtained by adding up the output currents of all the constant-current sources CS121 to CS124. The output current Tout at this state becomes the full-scale current Ifs. Therefore, the mirror-current ratio between the reference current Iref output from the reference current generation current source 111 and this full-scale current Ifs becomes 7:15.

Operations of the above-described D/A conversion circuit 100 of FIG. 2 are explained hereinafter. Firstly, operations of the reference current setting unit 110 are explained. Assume that the current fed by the PMOS transistor M111 is "I".

When the voltage amplitude setting signal is at a High level, the potential level at the node D1 becomes a Low level and the potential level at the node D2 becomes a High level. Therefore, the PMOS transistors MPSS21a, MPS22a and MPS23a become an On-state, and the PMOS transistors MPSS21b, MPS22b and MPS23b become an Off-state. Accordingly, the reference current Iref output from the reference current generation current source 111 flows through the adjustment resistance R1.

A voltage at the terminal T1 that occurs by the reference current Iref flowing through the adjustment resistance R1 is input to the non-inverting terminal of the amplifier AMP113. Negative feedback control is performed on the amplifier AMP113 by the voltage occurring at the terminal T1. Therefore, the amplifier AMP113 operates such that the voltage occurring at the terminal T1 becomes equal to the reference voltage Vref. Accordingly, the reference current Iref output from the reference current generation current source 111 is expressed as Iref=Vref/R1. Further, since the reference current Iref are the total current output from the PMOS transistors M111 to M113 of the reference current generation current source 111, it is expressed as Iref=I×7.

Next, a case where the voltage amplitude setting signal becomes a Low level is examined hereinafter. In this case, the potential level at the node D1 becomes a High level and the potential level at the node D2 becomes a Low level. Therefore, the PMOS transistors MPSS21a, MPS22a and MPS23a become an Off-state, and the PMOS transistors MPSS21b, MPS22b and MPS23b become an On-state. Accordingly, the reference current Iref output from the reference current generation current source 111 flows through the adjustment resistance R2.

A voltage at the terminal T2 that occurs by the reference current Iref flowing through the adjustment resistance R2 is input to the non-inverting terminal of the amplifier AMP113. Negative feedback control is performed on the amplifier AMP113 by the voltage occurring at the terminal T2. Therefore, the amplifier AMP113 operates such that the voltage occurring at the terminal T2 becomes equal to the reference voltage Vref. Accordingly, the reference current Iref output from the reference current generation current source 111 is expressed as Iref=Vref/R2. Since the resistance values of these adjustment resistances R1 and R2 are different, the current value of the reference current Iref is also changed. For example, assuming R1>R2, the current value of the reference current Iref becomes larger when the adjustment resistance R2 is selected (the voltage amplitude setting signal is at a Low level) than when the adjustment resistance R1 is selected (the voltage amplitude setting signal is at a High level). Further, since the reference current Iref is equal to the current output by the PMOS transistors M111 to M113 of the reference current generation current source 111, it is expressed as Iref=I×7. Therefore, the current value of the current I fed by the PMOS transistor M111 also becomes larger when the adjustment resistance R2 is selected than when the adjustment resistance R1 is selected.

Next, operations of the current cell output unit 120 are explained hereinafter. The current cell output unit 120 has a function of converting a received digital code (the digital data signal) to an analog signal. Firstly, a case where the digital code D[0:3] is "0000" is examined hereinafter. When the decoder DEC121 receives a digital code D[0:3] of "0000", it outputs control signals DP1, DP2, DP3 and DP4 having a High level, and control signals DP1b, DP2b, DP3b and DP4b having a Low level. Therefore, no output current Iout flows to the output terminal Tout, and the whole full-scale current Ifs (=I×15) flows to the ground terminal VSS. As a result, the analog output voltage Vout of the output terminal Tout becomes the ground voltage Vss.

Next, a case where the digital code D[0:3] is "0001" is examined. In this case, the decoder DEC121 outputs control signals DP1b, DP2, DP3 and DP4 having a High level, and control signals DP1, DP2b, DP3b and DP4b having a Low level. Therefore, an output current Tout of I×1 flows to the output terminal Tout. The remaining current flows to the ground terminal VSS. As a result, the analog output voltage Vout occurring at the output terminal Tout is expressed as (1/7)×I×RL.

When the digital code D[0:3] is "0010", the decoder DEC121 outputs control signals DP1, DP2b, DP3 and DP4 having a High level, and control signals DP1b, DP2, DP3b and DP4b having a Low level. Therefore, an output current Tout of I×2 flows to the output terminal Tout. The remaining current flows to the ground terminal VSS. As a result, the analog output voltage Vout occurring at the output terminal Tout is expressed as (2/7)×I×RL.

Similarly, when the digital code D[0:3] is "0011", an output current Iout of I×3 flows to the output terminal Tout, and therefore the analog output voltage Vout is expressed as (3/7)×I×RL. When the digital code D[0:3] is "0100", an output current Tout of I×4 flows to the output terminal Tout, and therefore the analog output voltage Vout is expressed as (4/7)×I×RL. In this manner, as the value of the digital code D[0:3] increases, the current flowing to the output terminal Tout and thus the analog output voltage Vout also increase. Finally, when the digital code D[0:3] is "1111", an output current Iout of I×15 flows to the output terminal Tout, and therefore the analog output voltage Vout is expressed as (15/7)×I×RL. Further, the current flowing to the ground terminal VSS becomes zero at this state.

In this way, the current cell output unit 120 can obtain an analog voltage Vout at intervals of 1/15 according to 4-bit digital code D[0:3]. Note that in this exemplary example, the current other than the output current Tout, i.e., the current Ifs-Iout is fed to the ground terminal VSS. In order to change the current value of the output current Tout at high speed in response to the change of the input digital code, it is necessary to feed a current constantly through the PMOS transistors M121 to M124 serving as the constant-current source circuit. Therefore, the D/A conversion circuit 100 is configured such that the current other than the current used as the output current Tout flows to the ground terminal VSS, so that the current path through which the current output by the PMOS transistors M121 to M124 flows is not cut off during the digital/analog signal conversion operation. With such a configuration, it is possible to speed up the digital/analog signal conversion operation of the D/A conversion circuit 100.

Note that the current I is defined based on the current fed by the PMOS transistor M111 of the reference current setting unit 110. As described above, the value of this current I is changed by the adjustment resistances R1 and R2, which are selected by the selection control circuit 112 according to the voltage amplitude setting signal. Therefore, when the selection control circuit 112 selects the adjustment resistance R1, it is expressed as I=Vref/R1, and on the other hand, when the selection control circuit 112 selects the adjustment resistance R2, it is expressed as I=Vref/R2. The relations of the above-described analog output voltage Vout, which varies according to the input digital, are summarized in a table shown in FIG. 3.

As can be seen from the table of FIG. 3, even when the same digital code is input, the value of the output voltage Vout is changed depending on the adjustment resistances R1 and R2, which are selected by the selection control circuit 112 according to the voltage amplitude setting signal. That is, the amplitude level of the output voltage Vout can be changed by two adjustment resistances R1 and R2, which are selected by the selection control circuit 112. Therefore, by setting the voltage amplitude setting signal at a High level or a Low level, it is possible to obtain the output voltage Vout conforming to two different types of voltage amplitude formats with ease.

Note that the example of FIG. 2 has such a circuit configuration that the selection control circuit 112 makes a selection from two adjustment resistances R1 and R2. In a case where three types of voltage amplitude formats are to be used, only requirement is to prepare three resistances from which the selection control circuit 112 make a selection. Alternatively, it is also possible to configure such that both the adjustment resistances R1 and R2 can be selected simultaneously, and by doing so, a voltage generated by their combined resistance is fed back to the amplifier AMP113 so that the third voltage amplitude format can be generated. To cope with a larger number of voltage amplitude formats, more than two adjustment resistances and a selection control circuit 112 capable of handling those adjustment resistances may be prepared. In this way, by increasing the number of adjustment resistances to be connected to the selection control circuit 112, it is possible to deal with a number of voltage amplitude formats with ease. Further, by arranging these adjustment resistances outside the D/A conversion circuit 100, it is possible to deal with various voltage amplitude formats by just replacing them with adjustment resistances having desired resistance values.

Figure 6:
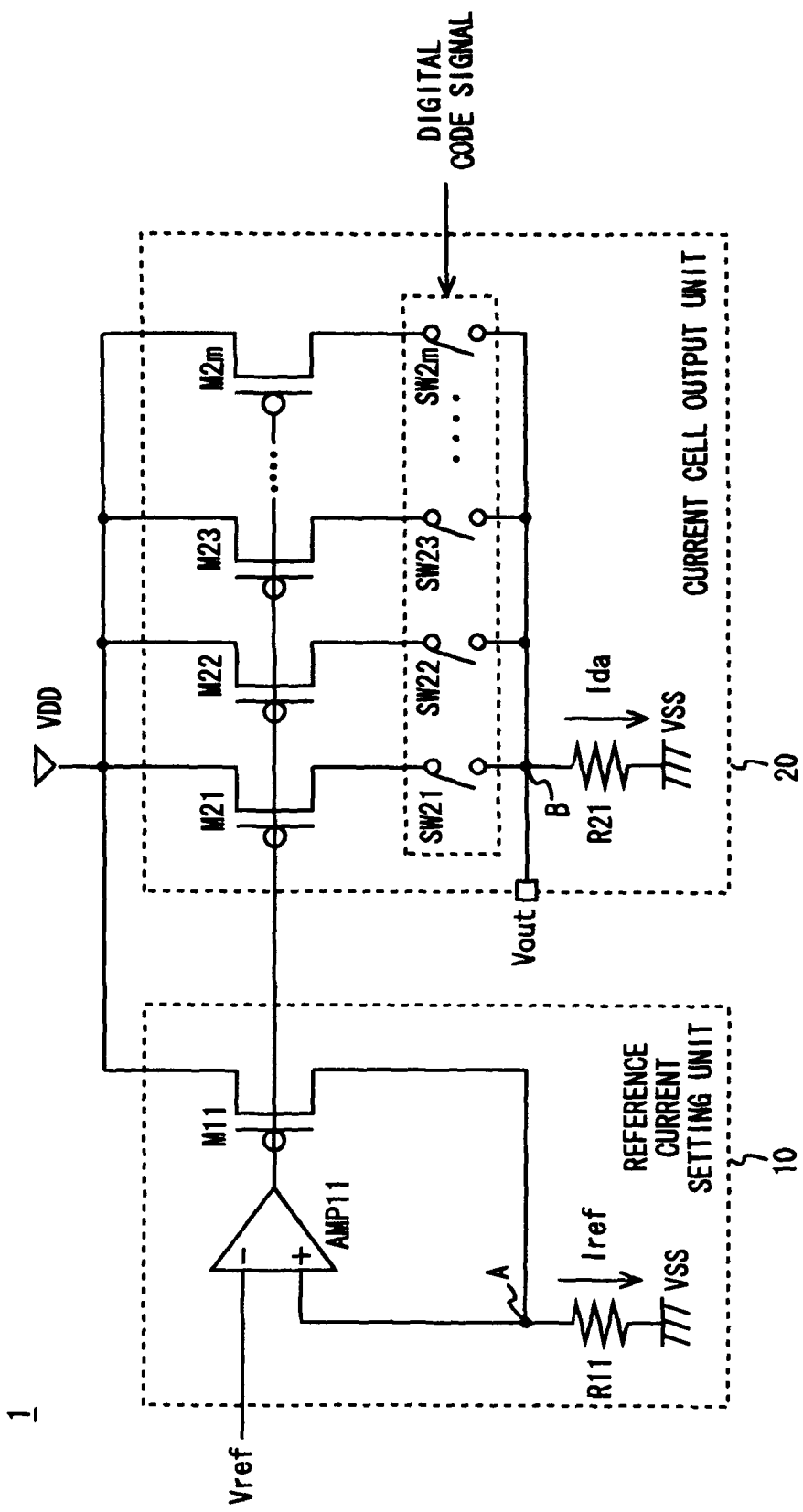
FIG. 6 is a circuit configuration of a D/A conversion circuit in the related art.

It should be noted that in the D/A conversion circuit 1 in the related art shown in FIG. 6, the reference resistance R11 of the reference current setting unit 10 needs to be replaced each time when an adjustment to the full-scale current Ifs of the current cell output unit 20 is necessary. Alternatively, in the case where the reference resistance R11 of the reference current setting unit 10 is set in accordance with an application that requires the maximum reference current Iref, the output voltage Vout needs to be adjusted by the input digital code when the voltage amplitude format is to be changed. However, in such a configuration, it is necessary to prepare switch circuits SW21 to SW2m so that they can deal with the respective voltage amplitude formats. That is, it is necessary to prepare switch circuits that operate for digital code for a voltage amplitude format having a large amplitude, switch circuits that operate for digital code for a voltage amplitude format having a small amplitude, switch circuits that operate for digital code for a voltage amplitude format having an intermediate amplitude, and so on. However, in such a configuration, a large number of switch circuits are required to obtain a proper resolution for digital/analog signal conversion, especially, in a voltage amplitude format having a smaller amplitude, and thus increasing the chip size. Further, when a voltage amplitude format having a smaller amplitude is used, many of switch circuits that are prepared for a voltage amplitude format having a larger amplitude are not used, and thus raising a problem in terms of circuit redundancy.

In a D/A conversion circuit 100 in accordance with this exemplary embodiment of the present invention, a plurality of adjustment resistances are connected, so that the full-scale current Ifs can be easily adjusted according to the adjustment resistance selected by the selection control circuit 112. Further, the full-scale current Ifs can be easily established by the resistance values of the adjustment resistances to be selected.

Figure 7:
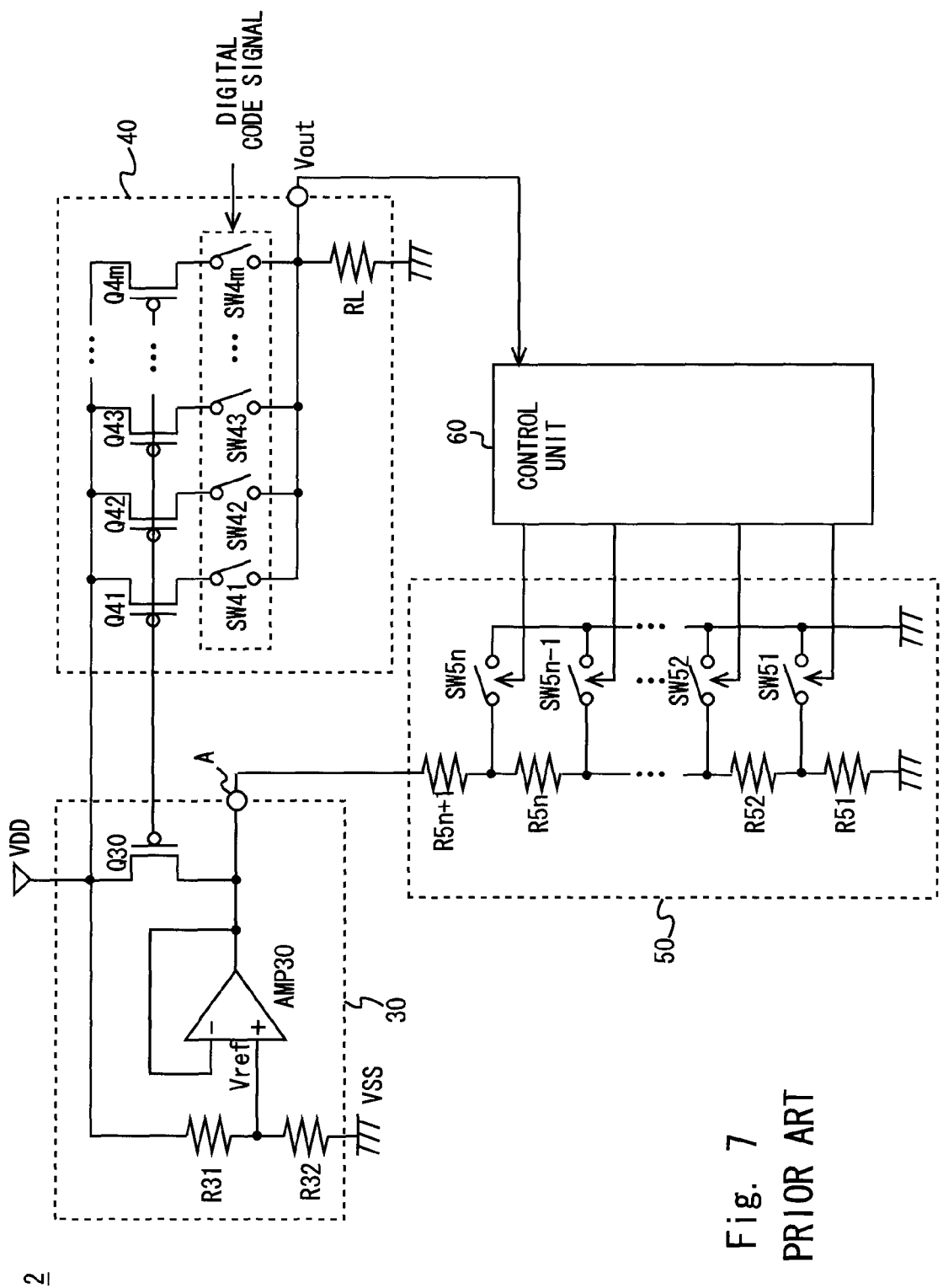
FIG. 7 is a circuit configuration of a D/A conversion circuit in the related art.

Further, in the current output type D/A conversion circuit 2 disclosed in Patent document 1 and shown in FIG. 7, the reference current Iref output from the reference current generation circuit 30 is controlled by bringing one of the switch circuits SW51 to SW5n of the ladder type resistance circuit 50 into an On-state. Therefore, the reference current Iref is determined by the combined resistance value of the combined resistance of resistive elements connected between a switch circuit selected by the control circuit 60 and the terminal A, and the On-resistance of the selected switch circuit. Therefore, to obtain a reference current Iref with high accuracy, the On-resistance of the switch circuits needs to be very small, and thus causing a problem that the size of the switch circuits and thereby the circuit scale are increased.

By contrast, in a D/A conversion circuit 100 in accordance with this exemplary embodiment of the present invention, a voltage occurring at the adjustment resistance through which the reference current Iref flows is fed back to the amplifier AMP113 such as an operational amplifier to adjust the reference current Iref. Therefore, although it includes a switch circuit to select one a plurality of adjustment resistances, there is no need to take the On-resistance of this switch circuit into consideration. Therefore, it does not suffer from the problem that the circuit scale is increased due to the increase in the size of the switch circuit in contrast to Patent document 1.

Figure 4:
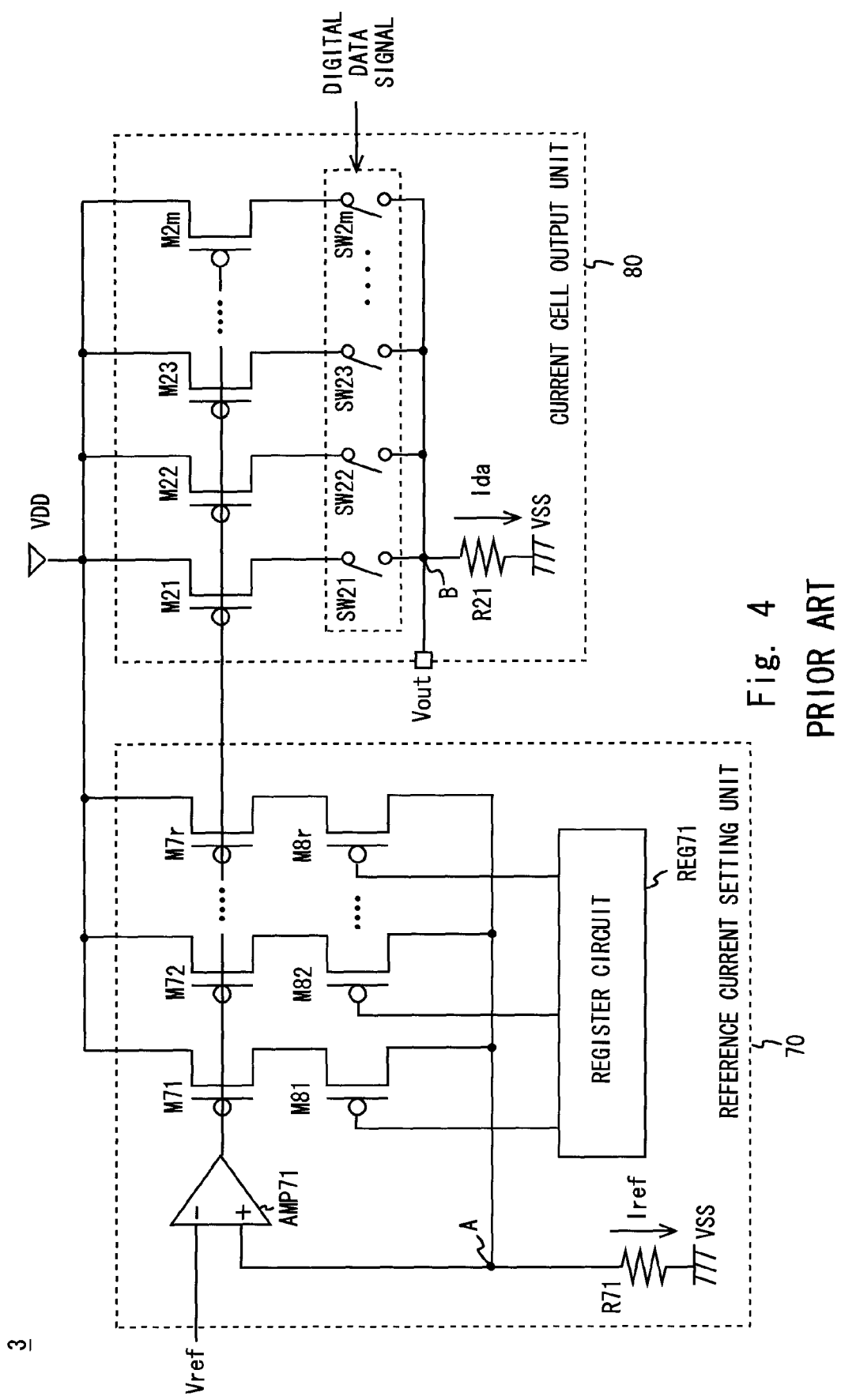
FIG. 4 is a circuit configuration of a D/A conversion circuit in the related art.

Further, FIG. 4 shows a D/A conversion circuit 3 of Patent document 2 as different prior art. The D/A conversion circuit 3 includes a reference current setting unit 70 and a current cell unit 80. Note that the current cell unit 80 has a similar configuration to that of the current cell unit 20 of the D/A conversion circuit 1. The reference current setting unit 70 includes PMOS transistors M71 to M7r (r: positive integer), PMOS transistors M81 to M8*r*, and a register circuit REG71. The PMOS transistors M71 to M7*r* of the reference current setting unit 70 are connected with the PMOS transistors M21 to M2*m* of the current cell unit 80 in a current-mirror connection. The PMOS transistors M71 to M7*r* serves as a constant-current source that supplies an amount of current according to the output of the amplifier AMP71. Each of the PMOS transistors M81 to M8*r* serves as a switch circuit that electrically connects or disconnects a corresponding one of the PMOS transistors M71 to M7*r* to or from the resistance R71 according to the set value of the register circuit REG71.

In this D/A conversion circuit 3, the reference current Iref of the current cell unit 80 can be adjusted according to the set value retained in the register circuit REG71 of the reference current setting unit 70. However, in this D/A conversion circuit 3, the number of resistances through which the reference current Iref flows is only one, i.e., the resistance 71. Therefore, the reference current Iref is limited to one current value. Therefore, the current-mirror ratio itself between the constant-current sources of the reference current setting unit 70 and the current cell unit 80 is changed according to the value retained in the register circuit REG71. Accordingly, to handle various voltage amplitude formats of the output voltage Vout, it is necessary to take current-mirror ratios corresponding to voltage amplitude formats to be used into consideration in advance in the design stage.

Further, in the D/A conversion circuit 3, in the case of an application where the full-scale current Ifs is roughly as small as the reference current Iref, the current-mirror ratios of the constant-current sources of the reference current setting unit 70 and the current cell unit 80 needs to be in the same level. That is, constant-current sources of the same scale need to be prepared between the reference current setting unit 70 and the current cell unit 80, and thus unnecessarily increasing the circuit scale of the reference current setting unit 70. On the other hand, the full-scale current Ifs is larger in comparison to the reference current Iref, the circuit needs to be designed so that the current-mirror ratio of the constant-current source of the current cell unit 80 become larger in comparison to the reference current setting unit 70. In such a case, the requirement for relative accuracy of transistor sizes between the constant-current source transistors that output the reference current Iref and the constant-current source transistors that output the full-scale current Ifs become very stringent. Especially, when the current value of the reference current Iref is small, it raises a problem that variations in the relative accuracy of transistor sizes could make it impossible to obtain an accurate analog output voltage Vout for an input digital code.

By contrast, in a D/A conversion circuit 100 in accordance with this exemplary embodiment of the present invention, since the current-mirror ratios of the constant-current sources of the reference current setting unit 110 and the current cell output unit 120 are not changed, it is unnecessary in their design to take the current-mirror ratios corresponding to voltage amplitude formats into consideration in the design stage. The current value of the full-scale current Ifs can be easily adjusted by just selecting one of a plurality of adjustment resistances. This feature improves the easiness of circuit design, and thus reducing the design costs such as shortening the design period. Further, as shown in FIG. 2, by using constant-current sources with similar current-mirror ratios in the reference current setting unit 110 and the current cell output unit 120, variations in the relative accuracy of transistor sizes are substantially eliminated, and thus making it possible to obtain an analog output voltage Vout for an input digital code with very high accuracy.

Figure 5:
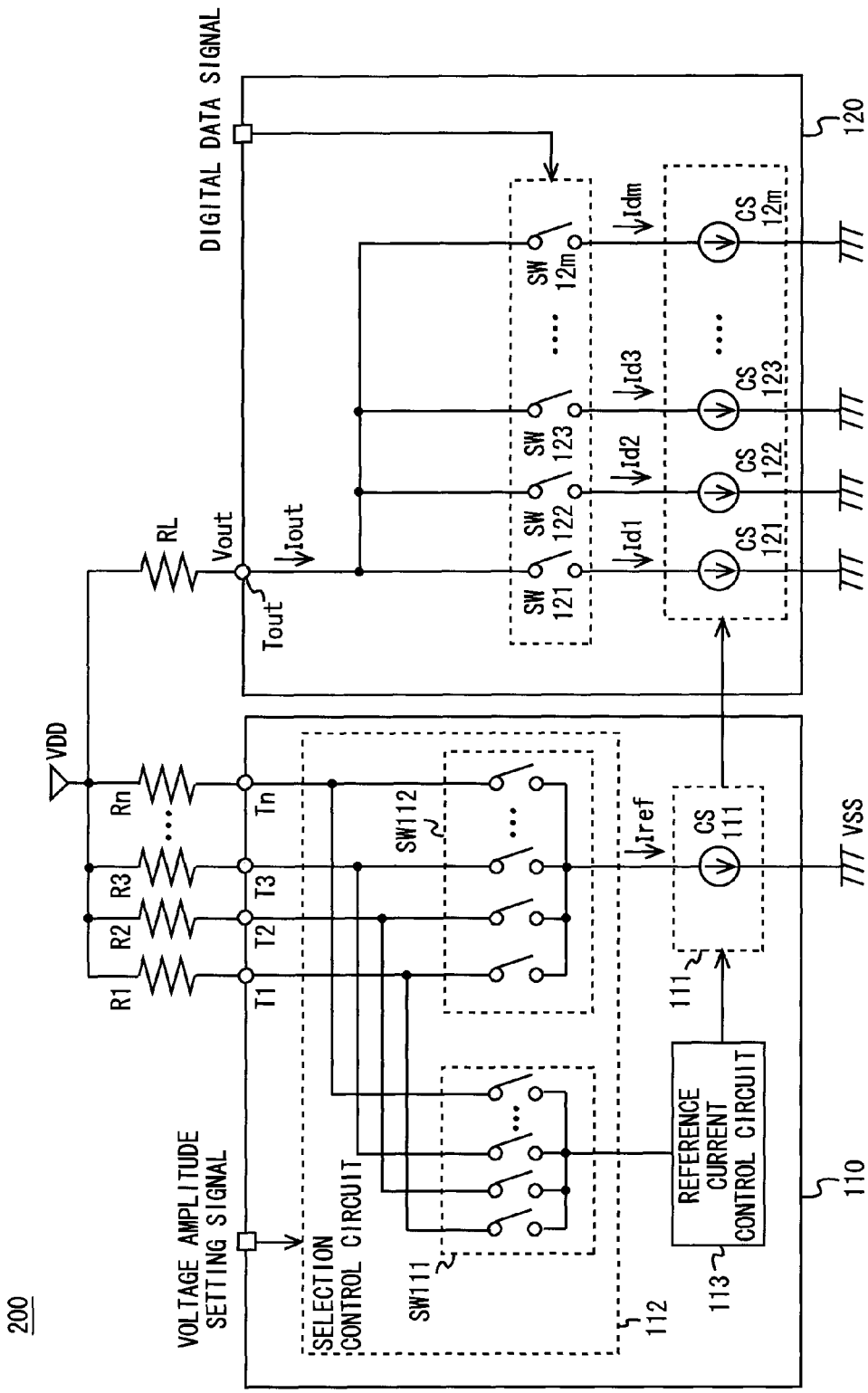
FIG. 5 shows an example of a block configuration of a D/A conversion circuit in accordance with another exemplary embodiment of the present invention.

Note that the present invention is not limited to the above-described exemplary embodiments, and various modifications can be made without departing from the spirit and scope of the present invention. For example as shown in FIG. 5, the relation between the power-supply voltages VDD and VSS may be reversed. However, in such a case, the conductive types of transistors used in the constant-current sources and switch circuits and the like need to be also reversed. Further, the circuit may also include a control circuit that synchronizes the operations of the selection control circuit 112 with those of the switch circuits SW121 to SW12*m* by using a clock signal. With such a configuration, when an instruction to change the voltage amplitude format is entered, the circuit can cope with a delay in response from the reference current setting unit 110, and thereby can prevent an undesired output voltage Vout from being output.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A D/A conversion circuit comprising:
   a reference current setting unit that sets a reference current; and
   a current cell output unit comprising a plurality of constant-current sources, the constant-current sources being configured to output currents corresponding to the reference current, the current cell output unit being configured to generate an analog voltage signal generated from an analog current signal obtained by adding up output currents from the constant-current sources according to a value of an input digital signal,
   wherein the reference current setting unit comprises:
   a reference current source that generates the reference current;
   a first resistive element through which the reference current flows;
   a second resistive element through which the reference current flows;
   a selection control circuit that, when an amplitude level of the analog voltage signal is to be changed, selects at least one of the first and second resistive elements and connects the selected resistive element to the reference current source; and
   a reference current control circuit that controls a current amount of a reference current of the reference current source according to a voltage generated by a resistive element selected from among the first and second resistive elements.

2. The D/A conversion circuit according to claim 1, wherein
   the selection control circuit comprises a first switch circuit connected between the reference current source and the first and second resistive elements, and
   when an amplitude level of the analog voltage signal is to be changed, the first switch circuit selects at least one of the first and second resistive elements and electrically connects the selected resistive element to the reference current source.

3. The D/A conversion circuit according to claim 2, wherein
- the selection control circuit comprises a second switch circuit connected between the reference current control circuit and the first and second resistive elements, and
- the second switch circuit electrically connects at least one of the first and second resistive elements selected by the first switch circuit to the reference current control circuit.

4. The D/A conversion circuit according to claim 3, wherein terminals of the first and second resistive elements are connected to the first and second switch circuits respectively, and the other terminals of the first and second resistive elements are connected to a first power-supply voltage.

5. The D/A conversion circuit according to claim 4, wherein
- the current cell output unit, the reference current source, the reference current control circuit, and the first and second switch circuits are constructed as a one-chipped semiconductor device, and
- terminals of the first and second resistive elements are connected through external terminals of the semiconductor device.

6. The D/A conversion circuit according to claim 1, wherein the reference current control circuit comprises an amplifier that compares a voltage generated by at least one resistive element selected from among the first and second resistive elements with a reference voltage, and outputs a control voltage according to its comparison result.

7. The D/A conversion circuit according to claim 6, wherein
- the reference current source comprises a first constant-current source that outputs the reference current according to the control voltage, and
- the plurality of constant-current sources included in the current cell unit output an output current according to the control voltage.

8. The D/A conversion circuit according to claim 7, wherein
- the first constant-current source comprises a first transistor that receives the control voltage through its control terminal, and
- the first transistor is connected to a group of transistors constituting the plurality of constant-current sources included in the current cell unit in a current-mirror connection.

9. The D/A conversion circuit according to claim 8, wherein the reference current source further comprises a second constant-current source that outputs the reference current according to the control voltage.

10. The D/A conversion circuit according to claim 9, wherein
- the second constant-current source comprises a second transistor, and
- the second transistor is connected to the first transistor in a current-mirror connection.

* * * * *